US012261620B2

(12) United States Patent
Goroju et al.

(10) Patent No.: US 12,261,620 B2
(45) Date of Patent: Mar. 25, 2025

(54) METHODS AND APPARATUS TO CAPTURE SWITCH CHARGE INJECTIONS AND COMPARATOR KICKBACK EFFECTS

(71) Applicant: Texas Instruments Incorporated, Dallas, TX (US)

(72) Inventors: Rajashekar Goroju, Bangalore (IN); Prasanth K, Bangalore (IN); Dileepkumar Ramesh Bhat, Bangalore (IN); Rakul Viswanath, Bangalore (IN); Sravana Kumar Goli, Bangalore (IN); Rahul Sharma, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 18/129,604

(22) Filed: Mar. 31, 2023

(65) Prior Publication Data

US 2024/0213998 A1   Jun. 27, 2024

(30) Foreign Application Priority Data

Dec. 22, 2022   (IN) .............................. 202241074406

(51) Int. Cl.
*H03M 1/38* (2006.01)
*H03M 1/06* (2006.01)
*H03M 1/08* (2006.01)
*H03M 1/16* (2006.01)
*H03M 1/46* (2006.01)
*H03M 1/80* (2006.01)

(52) U.S. Cl.
CPC ........... *H03M 1/38* (2013.01); *H03M 1/0607* (2013.01); *H03M 1/0818* (2013.01); *H03M 1/164* (2013.01); *H03M 1/468* (2013.01); *H03M 1/804* (2013.01)

(58) Field of Classification Search
CPC .... H03M 1/38; H03M 1/0607; H03M 1/0818; H03M 1/164; H03M 1/468; H03M 1/804
USPC .................................................. 341/161, 172
See application file for complete search history.

(56) References Cited

U.S. PATENT DOCUMENTS 9,998,131 B1 *   6/2018   Kinyua ............... H03F 3/45237
11,063,602 B1 *  7/2021   Bodnar ............... H03M 1/0626

OTHER PUBLICATIONS

Chioye, "SAR REF Input: The Capacitive DAC (CDAC), TIPL 4503 TI Precision Labs-ADS," dated 2017, viewable at TI.com, 14 pages.

* cited by examiner

*Primary Examiner* — Khai M Nguyen
(74) *Attorney, Agent, or Firm* — John R. Pessetto; Frank D. Cimino

(57) ABSTRACT

An example apparatus includes: controller circuitry configured to: provide switch signals to capacitive digital to analog converter (C-DAC) circuitry, the C-DAC circuitry including switches; configuring the switches into a third configuration begin an Auto Zero (AZ) phase with a third switch in a closed state; configuring the switches into a fourth configuration to repeat the transition of the third switch to the open state corresponding to a first configuration; configuring the switches into a fifth configuration to repeat the transition of a first switch and a second switch to the open state corresponding to a second configuration; configuring the switches into a sixth configuration to repeat the transition of the third switch to the closed state corresponding to a second configuration; and performing an AZ decision with the switches in the sixth configuration.

20 Claims, 10 Drawing Sheets

METHODS AND APPARATUS TO CAPTURE SWITCH CHARGE INJECTIONS AND COMPARATOR KICKBACK EFFECTS

CROSS-REFERENCE TO RELATED APPLICATION

This patent application claims the benefit of and priority to Indian Provisional Patent Application Serial No. 202241074406 filed Dec. 22, 2022, which Application is hereby incorporated herein by reference in its entirety.

TECHNICAL FIELD

This description relates generally to analog to digital converter circuits (ADC circuits), and more particularly to methods and apparatus to capture switch charge injections and comparator kickback effects.

BACKGROUND

Information may be represented in computing devices as either a digital or analog signal. In many applications, information requires conversion from an analog signal to a digital signal. For example, a device may receive a continuous analog signal that contains information. The analog signals may be transformed into discrete digital values. The device may use the digital values to interpret the information and perform operations based on the information.

ADC circuits convert analog voltages to digital values and are used in a variety of computing devices. In some examples, the digital to analog conversion can degrade the quality of the signal, causing information to be lost or distorted. Therefore, signal integrity may be used as a performance metric of an ADC circuit.

SUMMARY

For methods and apparatus to capture switch charge injections and comparator kickback effects, an example apparatus includes: controller circuitry configured to: provide switch signals to capacitive digital to analog converter (C-DAC) circuitry, the C-DAC circuitry including switches; configuring the switches into a third configuration begin an Auto Zero (AZ) phase with a third switch in a closed state; configuring the switches into a fourth configuration to repeat the transition of the third switch to the open state corresponding to a first configuration; configuring the switches into a fifth configuration to repeat the transition of the first switch and the second switch to the open state corresponding to a second configuration; configuring the switches into a sixth configuration to repeat the transition of the third switch to the closed state corresponding to a second configuration; and performing an AZ decision with the switches in the sixth configuration.

BRIEF DESCRIPTION OF THE DRAWINGS

The same reference numbers or other reference designators are used in the drawings to designate the same or similar (functionally and/or structurally) features.

DETAILED DESCRIPTION OF EXAMPLE EMBODIMENTS

Figure 1:
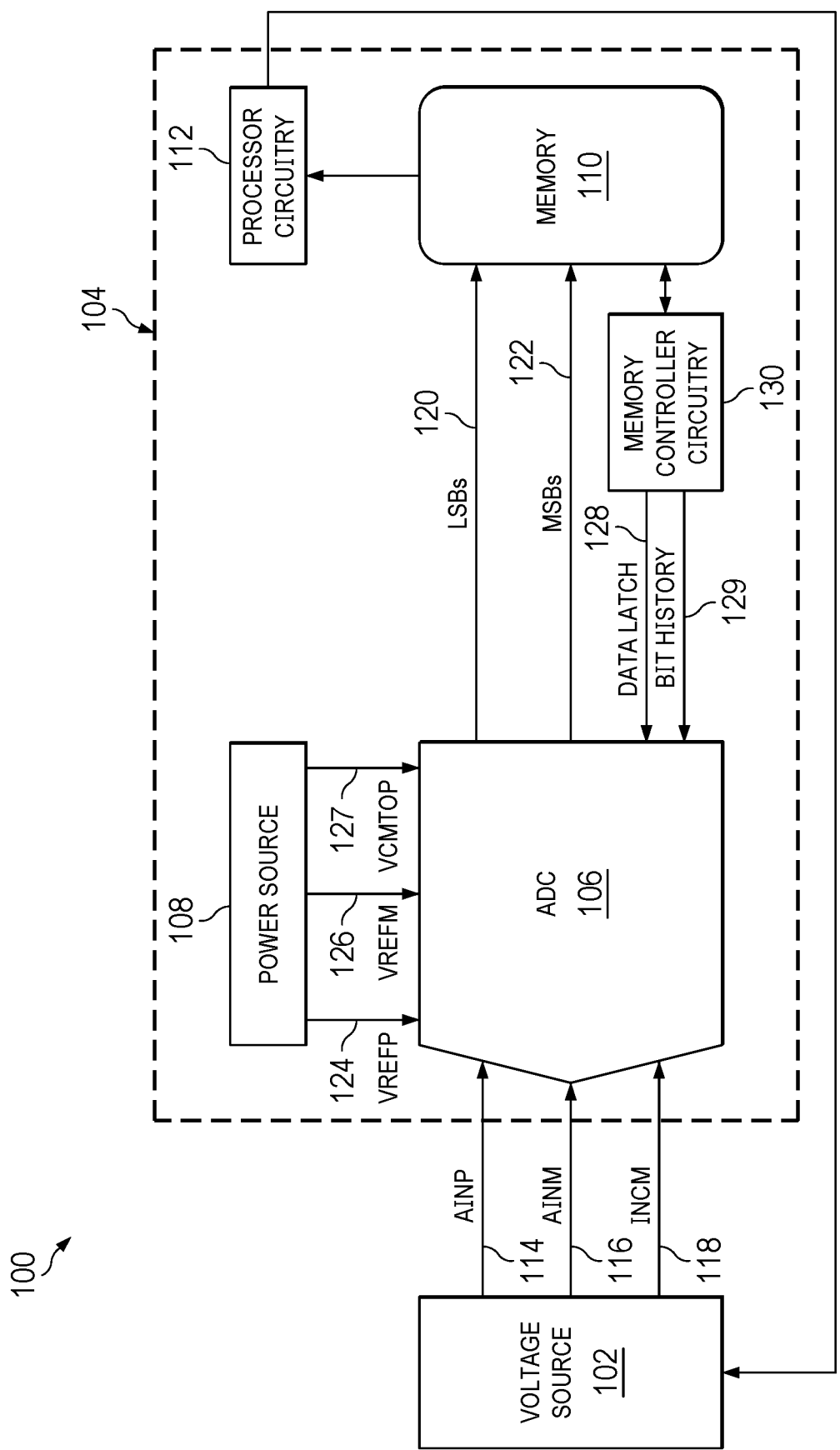
FIG. 1 is an example block diagram of a compute environment.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

ADC circuits may be implemented in a wide variety of architectures. One such architecture is a multi-stage Successive Approximation Register (SAR) ADC circuit. In examples described herein, a multi-stage SAR ADC circuit contains two sub-ADC circuits that convert different portions of the analog signal to digital values in stages. A sub-ADC circuit is one ADC circuit within a plurality of ADCs that are configured together. The plurality of sub-ADCs are configured to collectively convert an analog sample into one digital value, while a single sub-ADC is configured to convert part of the analog sample into part of the digital value (e.g., a subset of bits).

Within a first sub-ADC circuit, the first portion of an analog signal is converted into a digital value using a network of switches. To convert the analog signal to a digital value, a controller configures the switches within the network to transition states (e.g. to open or close) in a particular sequence. Multi-stage ADC circuits are described further in connection with FIGS. 2 and 6.

One metric used to measure ADC circuit signal integrity is offset voltage. Offset voltage refers to an output voltage of the ADC circuit while the differential input is zero. For example, if an ADC circuit receives an analog voltage of 1.000 V, the example ADC circuit converts the 1.000 V into a number of digital values, which are subsequently converted back into an analog voltage by an ideal digital to analog converter circuit (DAC circuit). If the output voltage of the ideal DAC circuit is 1.001 V, despite the ideal DAC circuit not producing any error, the offset voltage of the ADC circuit is 1 milli-Volt (mV).

Many applications specify a maximum acceptable offset voltage to satisfy a safety and/or performance requirement. In examples disclosed herein, the total error caused by the first stage of example multi-stage SAR ADC circuitry has a 25 mV threshold. By having a total error less than or equal to 25 mV, the stage SAR ADC circuitry described can support high precision and high performance use cases. In other examples, the offset of an ADC circuit has a different offset voltage requirement.

All ADC architectures have some level of offset voltage. Within multi-stage ADC circuits, offset voltage occurs in part because the transistors used to implement the network of switches in an integrated circuit (IC) include parasitic capacitance. When a switch is opened, extra current from the parasitic capacitance flows through a node of the switch network. In some examples, the foregoing release of current from parasitic capacitance is referred to as charge injection. The injected charge is not representative of the analog signal and causes error in the form of offset voltage.

Many multi-stage SAR ADC circuits include an auto zero (AZ) window to mitigate the effects of charge injection and offset voltages. An AZ window refers to a period of time between consecutive samples of the analog signal. During an AZ window, the multi-stage ADC circuit may estimate the effects of charge injection and modify an output signal to counteract the offset.

Current solutions that implement multi-stage SAR ADC circuits with an AZ phase have disadvantages. For example, estimation techniques used by such solutions may capture charge injection from some but not all switches within the network. The inaccuracies from the AZ phase of current solutions may lead to inaccurate charge injection estimations, inaccurate modifications of the output signal, and higher offset voltages. As a result, current solutions are unable to support high-precision and high-performance use cases with strict offset voltage requirements (such as 1 mV).

Example methods, apparatus and systems herein support high precision and high performance ADC use cases. In particular, example ADC circuitry examples described herein implement a multi-stage SAR ADC. The example multi-stage SAR ADC implements an example AZ phase that measures charge injection from sources both internal and external to the sub-ADC. Within the sub-ADC circuit, the example AZ phase also repeats the switch transitions from a sample phase and conversion phase. As a result, the example ADC circuitry described herein exhibits less offset voltage and is more accurate than other solutions.

FIG. 1 is a block diagram of an example compute environment 100. The example environment 100 includes an example voltage source 102 and an example device 104. The example device 104 includes example ADC circuitry 106, an example power source 108, example memory 110, and example processor circuitry 112. The example environment 100 also includes an example analog input positive (AINP) signal 114, an example analog input minus (AINM) signal 116, an example input common mode (INCM) signal 118, example least significant bits (LSBs) 120, example most significant bits (MSBs) 122, an example voltage reference positive (VREFP) signal 124, an example voltage reference minus (VREFM) signal 126, an example voltage common mode top (VCMTOP) signal 127, an example data latch signal 128, an example bit history signal 129, and the example memory controller circuitry 130.

While an example manner of implementing the device 104 is shown in FIG. 1, one or more of the ADC circuitry 106, power source 108, memory 110, processor circuitry 112, and memory controller circuitry 130 may be combined, divided, re-arranged, omitted, eliminated, and/or implemented in any other way. Further, the ADC circuitry 106, power source 108, memory 110, processor circuitry 112, and memory controller circuitry 130 may be implemented by hardware alone or by hardware in combination with software and/or firmware. In some examples, the ADC circuitry 106 is implemented on a first IC which is separate from the one or more ICs used to implement the power source 108, memory 110, processor circuitry 112, and memory controller circuitry 130.

The example voltage source 102 generates the example AINP signal 114, the example AINM signal 116, and the example INCM signal 118. The example AINP signal 114 and the example AINM signal 116 are two portions of a differential signal that, when interpreted together, contain information. The example INCM signal 118 is the average of the AINP signal 114 and the AINM signal 116. The example INCM signal 118 can be used to produce (generate and/or provide) linear output values when performing operations that use the differential signal as an input.

The example voltage source 102 may be implemented as any type of device and may generate the foregoing signals for any purpose. For example, the voltage source 102 may be sensor circuitry that generates the example AINP signal 114, the example AINM signal 116, and the example INCM signal 118 to perform a measurement. In another example, the voltage source 102 may be transceiver circuitry that generates the signals in response to receiving data over a transmission medium (e.g., a cell network, a cable, etc.). In some examples, the example AINP signal 114, the example AINM signal 116, and the example INCM signal 118 change over time.

Within the example device 104, the example ADC circuitry 106 receives the example AINP signal 114, the example AINM signal 116, and the example INCM signal 118 from the voltage source. The example ADC circuitry 106 generates digital values corresponding to the information in the differential analog input signal as described in this description. A given digital value produced by the example ADC circuitry 106 is composed of a set of bits. A given bit within the digital value is categorized as part of either the LSBs 120 or the MSBs 122. The example ADC circuitry 106 is described further in connection with FIG. 2.

Within the example device 104, the example power source 108 provides the example VREFP signal 124, the example VREFM signal 126, and the example VCMTOP signal 127 to the example ADC circuitry 106 to use when generating the digital bits. In particular, the example VREFP signal 124 and example VREFM signal 126 provide constant voltages that the differential signal can be measured against. The example ADC circuitry 106 uses the example VCMTOP signal 127 to stabilize the voltage of an internal node. The example VREFP signal 124, the example VREFM signal 126, and the example VCMTOP signal 127 are described further in FIGS. 5A, 5B, and 5C. While illustrated within the example device 104 in FIG. 1, in other examples, the power source 108 may be implemented elsewhere in the environment 100.

Within the example device 104, the example memory 110 stores the LSBs 120 and the MSBs 122 generated by the ADC circuitry 106. In particular, the example memory 110 includes a SAR that stores data used to generate the finalized LSBs 120 and MSBs 122. The example memory 110 may be implemented as any type of memory. For example, the example memory 110 may be a volatile memory or a non-volatile memory. The volatile memory may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory may be implemented by flash memory and/or any other desired type of memory device.

The example memory controller circuitry 130 communicates with the example memory 110 to determine the status of various memory addresses and provide the information to other components of the device 104. For example, the memory controller circuitry 130 generates the data latch signal 128, which describes when a particular set of bits generated by the ADC circuitry 106 have been successfully stored in an address of the memory 110.

The example memory controller circuitry 130 also provides the bit history signal 129 to the ADC circuitry 106. The example bit history signal 129 includes the digital values that have already been generated by the example ADC circuitry 106. For example, if the ADC circuitry 106 is generating a fourth bit of an eight bit value, the bit history signal 129 may contain the three bits that were generated in previous cycles. In such examples, the three bits were originally stored in memory as part of the LSBs 120 and/or the MSBs 122. As described further below in connection with FIG. 6, the example ADC circuitry 106 uses the data latch signal 128 and the bit history signal 129 when generating digital values. In some examples, one or more of the LSBs 120, MSBs 122, data latch signal 128, and bit history signal 129 are transmitted across a data bus. In such examples, the data bus physically couples (e.g., with one or more wires or traces) the ADC circuitry 106, memory 110, and memory controller circuitry 130 to one another.

The example processor circuitry 112 receives the LSBs 120 and the MSBs 122 from the memory 110 and performs operations based on the digital values. For example, the digital values may cause the processor circuitry 112 to send a control signal to the voltage source 102, as illustrated in FIG. 1.

Figure 2:
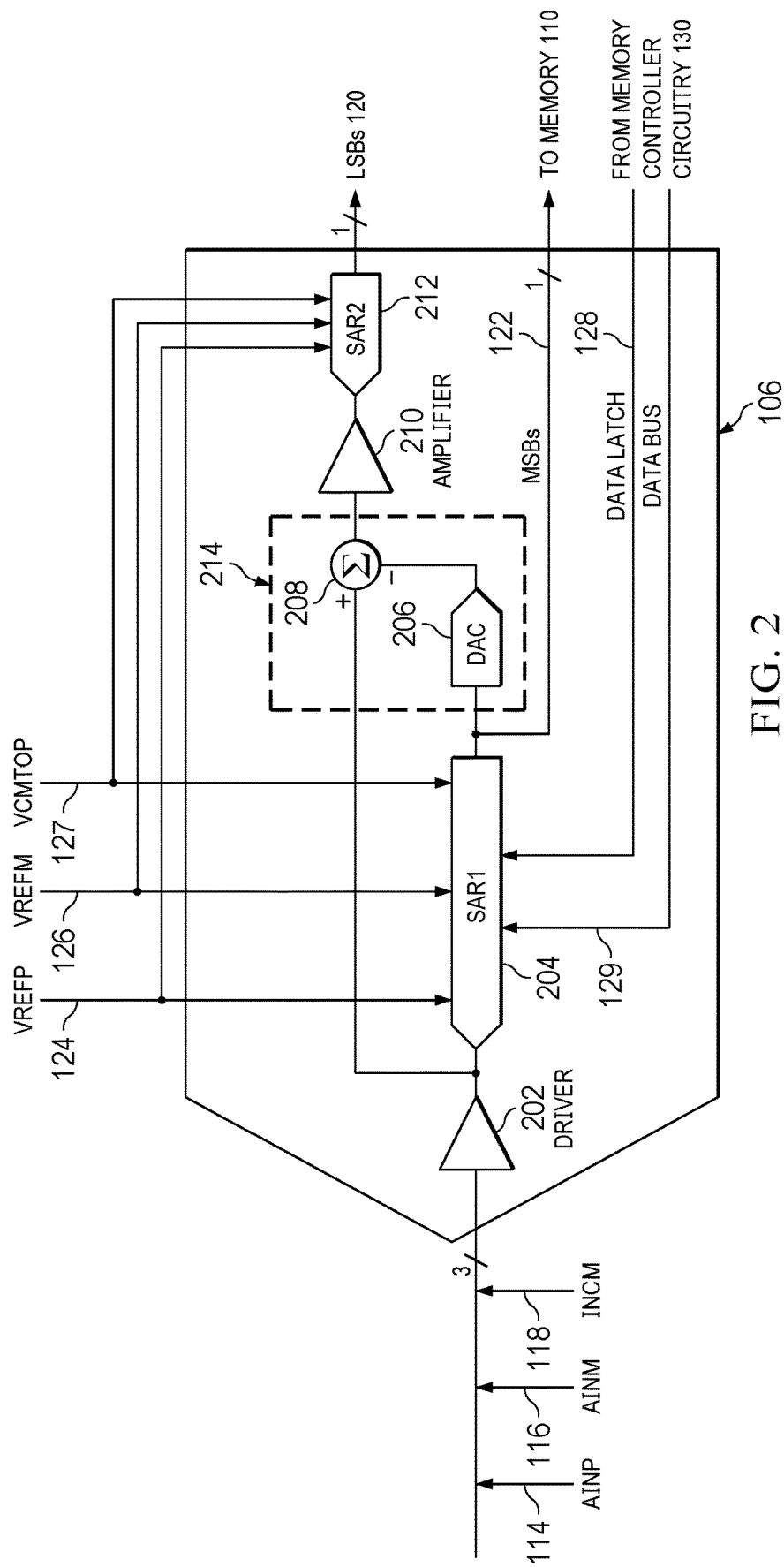
FIG. 2 is an example block diagram of the ADC circuitry of FIG. 1.

FIG. 2 is an example block diagram of the ADC circuitry 106 of FIG. 1. The example ADC circuitry 106 includes example driver circuitry 202, example SAR1 ADC circuitry 204, example DAC circuitry 206, example subtractor circuitry 208, example amplifier circuitry 210, and example SAR2 ADC circuitry 212. The example DAC circuitry 206 and the example subtractor circuitry 208 collectively form Multiplicative Digital to Analog Converter (MDAC) circuitry 214.

In examples other than FIG. 2, a multi-stage SAR ADC architecture such as the ADC circuitry 106 contains more than two sub-ADC circuits. In such an implementation of the ADC circuitry 106 with an arbitrary number n of sub-ADCs, each of the n sub-ADCs can generate a mutually exclusive set of bits. Collectively, the mutually exclusive set of bits can be combined to form a single digital value representative of an analog sample. Furthermore, an implementation of the ADC circuitry 106 with n total sub-ADC circuits may include one instance of MDAC circuitry 214 and one instance of amplifier circuitry 210 for each of the (n−1) sub-ADC circuits.

The example driver circuitry 202 receives the AINP signal 114, the AINM signal 116, and the INCM signal 118 and re-transmits the signals to the SAR1 ADC circuitry 204. In doing so, the example driver circuitry 202 may increase the current flowing through the foregoing signals. By increasing current flow, the example ADC circuitry 106 is more compatible with lower power implementations of the voltage source 102. The example driver circuitry 202 may be implemented by any suitable circuit that can increase the current flow of the AINP signal 114, the AINM signal 116, and the INCM signal 118. For example, the driver circuitry 202 is implemented by circuits that include but are not limited to a buffer, a unity gain amplifier, a sampler, etc. In examples where the driver functionality is implemented as a sampler, the driver circuitry 202 is not separate from the SAR1 ADC circuitry 204 (as illustrated in FIG. 2). Rather, in such examples, the SAR1 ADC circuitry 204 implements the driver functionality when sampling the signal.

The example SAR1 ADC circuitry 204 converts the AINP signal 114, the AINM signal 116, and the INCM signal 118 into the MSBs 122 as described in this description. The example SAR1 ADC circuitry 204 also uses the VREFP signal 124, the VREFM signal 126, the VCMTOP signal 127, the data latch signal 128, and the bit history signal 129 when producing the MSBs 122. The example SAR1 ADC circuitry 204 is described further in connection with FIG. 3.

The example DAC circuitry 206 converts the MSBs 122 back into analog voltages. In particular, the example DAC circuitry produces a positive differential voltage, a negative differential voltage, and an input common mode voltage that all correspond to the MSBs 122.

The example subtractor circuitry 208 performs three separate subtraction operations. In particular, the example subtractor circuitry 208 subtracts the three voltages produced by the DAC circuitry 206 from the corresponding voltages produced by the driver circuitry 202 (i.e., the held voltage of the AINP signal 114, the AINM signal 116, and the INCM signal 118). In doing so, the example subtractor circuitry 208 removes the information from the original input signals that corresponds to the MSBs 122.

The example amplifier circuitry 210 amplifies the output values of the subtractor circuitry 208. The example amplifier circuitry 210 may increase the magnitude of the differential voltages so that the voltages are interpretable by the SAR2 ADC circuitry 212.

The example SAR2 ADC circuitry 212 converts the amplified voltages into the LSBs 120. The example SAR2 ADC circuitry 212 uses the VREFP signal 124, the VREFM signal 126, and the VCMTOP signal 127 to produce the LSBs 120. In some examples, the SAR2 ADC circuitry 212 produces the LSBs 120 using signals from the memory controller circuitry 130 that are separate from the data latch signal 128.

The example ADC circuitry 106 is an example implementation of a multi-stage SAR ADC architecture. In particular, the example ADC circuitry 106 implements SAR1 ADC circuitry 204 to produce the first half of a digital value (i.e., the MSBs 122) and implements SAR2 ADC circuitry 212 to produce the second half of the digital value (i.e., the LSBs 120).

A wide variety of components within a multi-stage SAR ADC architecture may contribute to an offset voltage. For example, a difference between a first output voltage produced by a first capacitive—digital to analog converter (C-DAC) circuit of the SAR1 ADC circuitry 204 and a second output voltage produced by a second C-DAC circuit of the MDAC circuitry 214 can result in offset voltage. Advantageously, the example ADC circuitry 106 is designed such that the C-DAC circuit of the SAR1 ADC circuitry 204 includes the same components in the same configuration as the C-DAC circuits within the SAR2 ADC circuitry 212 and the MDAC circuitry 214. Therefore, the example ADC circuitry 106 may produce less offset voltage than other multi-stage SAR ADC solutions that design SAR1 ADC circuitry independently from the SAR2 ADC circuitry and/or MDAC circuitry.

Figure 3:
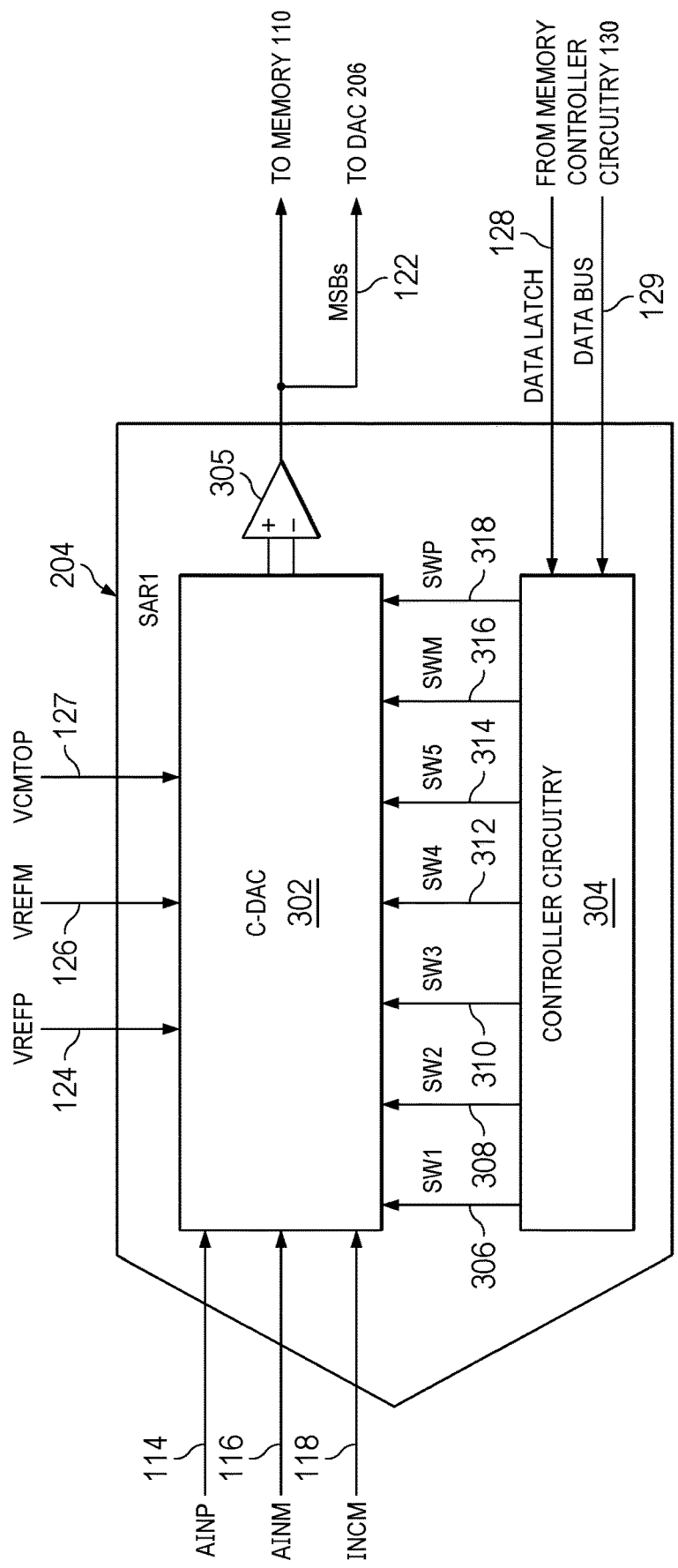
FIG. 3 is an example block diagram of the Successive Approximation Register 1 (SAR1) ADC circuitry of FIG. 2.

FIG. 3 is an example block diagram of the SAR1 ADC circuitry 204 of FIG. 2. The example SAR1 ADC circuitry 204 includes example capacitive—digital to analog converter (C-DAC) circuitry 302, example controller circuitry 304, and example comparator circuitry 305.

FIG. 3 also includes an example switch 1 (SW1) signal 306, an example switch 2 (SW2) signal 308, an example switch 3 (SW3) signal 310, an example switch 4 (SW4) signal 312, an example switch 5 (SW5) signal 314, an example switch minus (SWM) signal 316, and an example switch positive (SWP) signal 318, collectively referred to as example switch signals. As used above and herein, a switch signal refers to a control signal provided to a control terminal (e.g., a gate) of a switch (e.g., one or more transistors) to transition the switch between an open state (e.g., a non-conductive state) and a closed state (e.g., a conductive state).

The example C-DAC circuitry 302 is a collection of electrical components, including switches, resistors, and capacitors, coupled together in a manner that enables the circuitry to convert the AINP signal 114, the AINM signal 116, and the INCM signal 118 into a positive comparator voltage and a negative comparator voltage. The example C-DAC circuitry 302 uses the VREFP signal 124, the VREFM signal 126, the VCMTOP signal 127, and the example switch signals to produce the MSBs 122. The example C-DAC circuitry 302 is described further in connection with FIG. 4.

The example controller circuitry 304 generates the switch signals as described in this description. As described further below in connection with FIG. 4, each of the example switch signals controls control when respective ones of the switches within the example C-DAC circuitry 302 transition between an open state and a closed state. For example, the example controller circuitry 304 uses the data latch signal 128 and the bit history signal 129 to determine when one or more switches within the example C-DAC circuitry 302 will transition between states.

The example controller circuitry 304 may be implemented by any form of processor circuitry. Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). The example controller circuitry 304 is described further in connection with FIGS. 5A-7.

The example comparator circuitry 305 includes a positive terminal coupled to the C-DAC circuitry 302 to receive a positive comparator voltage and a negative terminal coupled to the C-DAC circuitry 302 to receive a negative comparator voltage. The example comparator circuitry 305 generates the MSBs 122 by comparing the first voltage at the positive terminal to the second voltage at the negative terminal. If the first voltage is greater than the second voltage, the comparator circuitry 305 produces a logical '1' bit. Conversely, if the first voltage is less than the second voltage, the comparator circuitry 305 produces a logical '0' bit.

Figure 4:
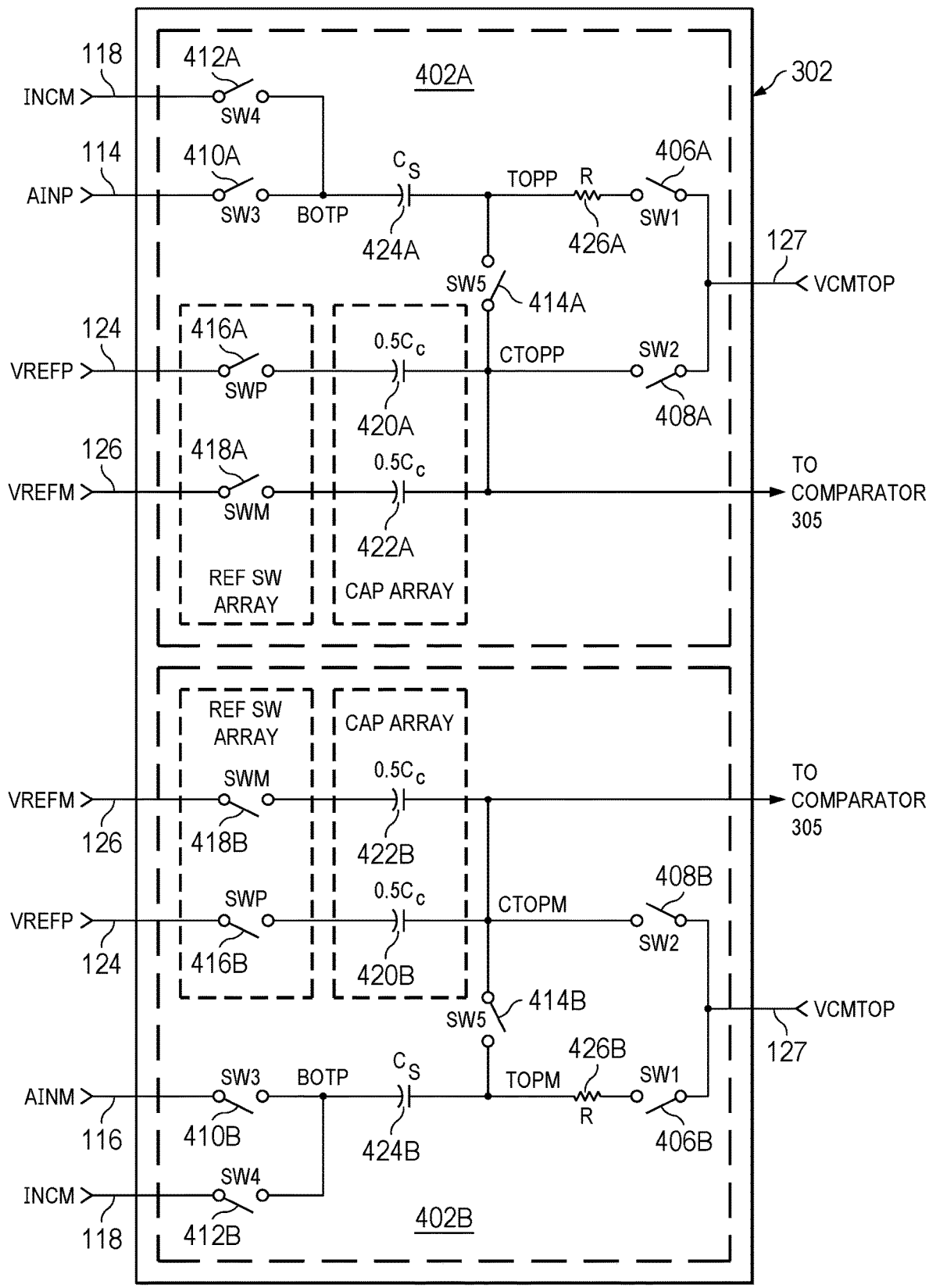
FIG. 4 is an example block diagram of the C-DAC circuitry of FIG. 3.

FIG. 4 is an example block diagram of the C-DAC circuitry 302 of FIG. 3. FIG. 4 includes a plurality of circuit elements subdivided into example first circuitry 402A and example second circuitry 402B. The example first circuitry 402A includes an example SW1 406A, an example SW2 408A, an example SW3 410A, an example SW4 412A, an example SW5 414A, an example SWP 416A, an example SWM 418A, an example conversion capacitor $C_C$ 420A, an example conversion capacitor $C_C$ 422A, an example sampling capacitor $C_S$ 424A, and an example resistor 426A. Similarly, the example second circuitry 402B of the C-DAC circuitry 302 an example SW1 406B, an example SW2 408B, an example SW3 410B, an example SW4 412B, an example SW5 414B, an example SWP 416B, an example SWM 418B, an example conversion capacitor $C_C$ 420B, an example conversion capacitor $C_C$ 422B, an example sampling capacitor $C_S$ 424B, and an example resistor 426B.

In the example block diagram of FIG. 4, all switches within the example C-DAC circuitry 302 are implemented as single-pole single-throw switches for simplicity. In other examples, the C-DAC circuitry 302 may alternatively be implemented with other types of switches (e.g., double-pole double-throw switches) where logically equivalent to the block diagram of FIG. 4. Likewise, the example $C_C$ 420A is illustrated as a single capacitor for simplicity. In other examples, $C_C$ 420A is implemented as a set of capacitors that are connected to a terminal that receives the example VREFP signal 124 through a corresponding set of SWP switches. Similarly, in some examples, each of the example $C_C$ 422A, the example $C_C$ 420B, and the example $C_C$ 420B are implemented by separate sets of capacitors.

In the example of FIG. 4, the switches within the example C-DAC circuitry 302 are implemented by one or more n-channel metal-oxide semiconductor field-effect transistors (MOSFETs). Alternatively, the switches within the example C-DAC circuitry 302 may be implemented by one or more n-channel field-effect transistors, n-channel insulated-gate bipolar transistor (IGBT)s, n-channel junction field effect transistors (JFETs), NPN bipolar junction transistor (BJT)s and/or, with slight modifications, p-type equivalent devices.

The example second circuitry 402B is a mirrored version of the example first circuitry 402A in that both circuits contain the same electrical components with the same internal connections, same capacitance values, and same resistance values. However, the example SW3 410A is connected to a terminal that receives the AINP signal 114, while the example SW3 410B is connected to a terminal that receives the AINM signal 116. Furthermore, the first circuitry 402A is coupled to the negative terminal of the comparator circuitry 305, while the second circuitry 402B is coupled to the positive terminal of the comparator circuitry 305.

The example controller circuitry 304 controls the example C-DAC circuitry 302 by implementing mirrored functionality on the example first circuitry 402A and the example second circuitry 402B. For example, the SW1 signal 306 determines the state of both SW1 406A and SW1 406B, the SW2 signal 308 determines the state of both SW2 408A and SW2 408B, etc. As a result, at any point in time, SW1 406A and SW1 406B share the same state (i.e., both opened or both closed), SW2 408A and SW2 408B share the same state, etc.

Through the switch signals, the example controller circuitry 304 is configured to transition the example C-DAC circuitry 302 between a sample phase, a conversion phase, and an AZ phase. In the sample phase, the example first circuitry 402A samples a voltage from the AINP signal 114 while the example second circuitry 402B simultaneously samples a voltage from the AINM signal 116. In the conversion phase, the example first circuitry 402A converts the sampled AINP signal into a first voltage provided to the negative terminal of the comparator circuitry 305. The example second circuitry 402B simultaneously converts the sampled AINM signal into a second voltage provided to the positive terminal of the comparator circuitry 305. During the conversion phase, the example comparator circuitry 305 also compares the first voltage at the positive terminal to the second voltage at the negative terminal to produce the MSBs 122, as described above.

In general, other solutions to reduce offset within a sub-ADC of a multi-stage SAR ADC architecture focus on the comparator. In particular, a controller in a different solution may short the input terminals of the comparator to measure the probability of a comparator decision being 1 and 0. Ideally both are equally probable. The controller of the other solution may then adjust internal properties of the comparator to provide the equal probability of 1 and 0, while the inputs are shorted. Such a technique may be referred to as an offset sample or an AZ sample. While offset samples account for the small fluctuations in voltage at comparator inputs as a source of offset voltage, these solutions fail to consider sources of offset voltage from other electrical components within a switch network of a sub-ADC.

Advantageously, the example controller circuitry 304 measures and corrects for multiple sources of offset voltage within the example SAR1 ADC circuitry 204. The multiple sources of offset voltage may include, but are not limited to, the example comparator circuitry 305, the switches within the example C-DAC circuitry 302, and the capacitors within the example C-DAC circuitry 302. To account for the multiple sources, the example controller circuitry 304 causes the example C-DAC circuitry 302 to enter an example AZ phase as described in this description. During the example AZ phase, the example C-DAC circuitry 302 measures and corrects for sources of error in the previous sample and conversion phase. Sources of error from the sample and conversion phase include but are not limited to charge injection caused by switch transitions, capacitor leakage, and comparator kickback noise. As a result, the example SAR1 ADC circuitry 204 exhibits less offset voltage and satisfies more restrictive performance requirements (e.g., having an offset voltage ≤1 mV) than other solutions. The example AZ phase is described further in FIG. 6.

Figure 5A:
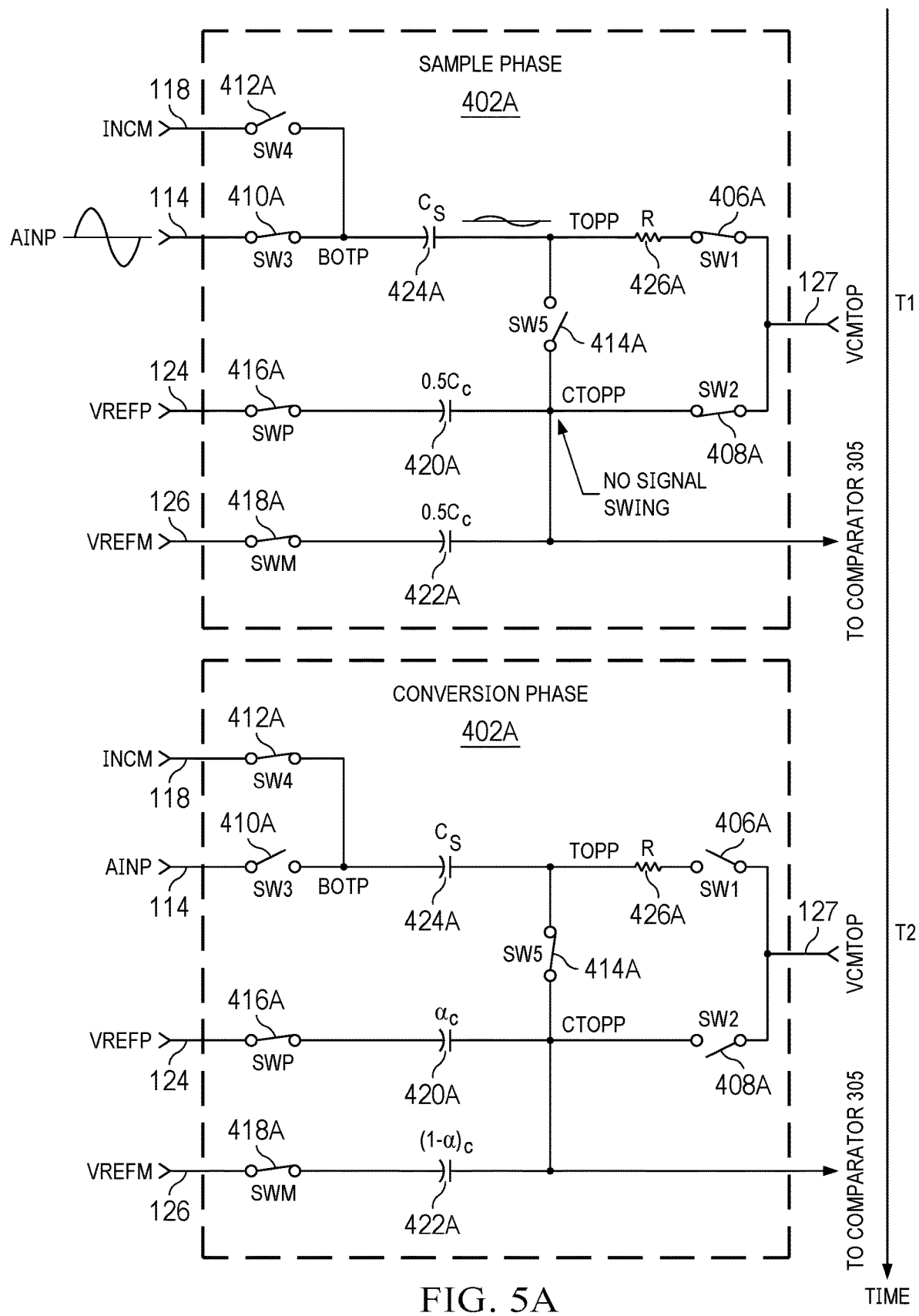
FIGS. 5A, 5B, and 5C illustrate multiple configurations of the C-DAC circuitry of FIG. 3.
Figure 5B:
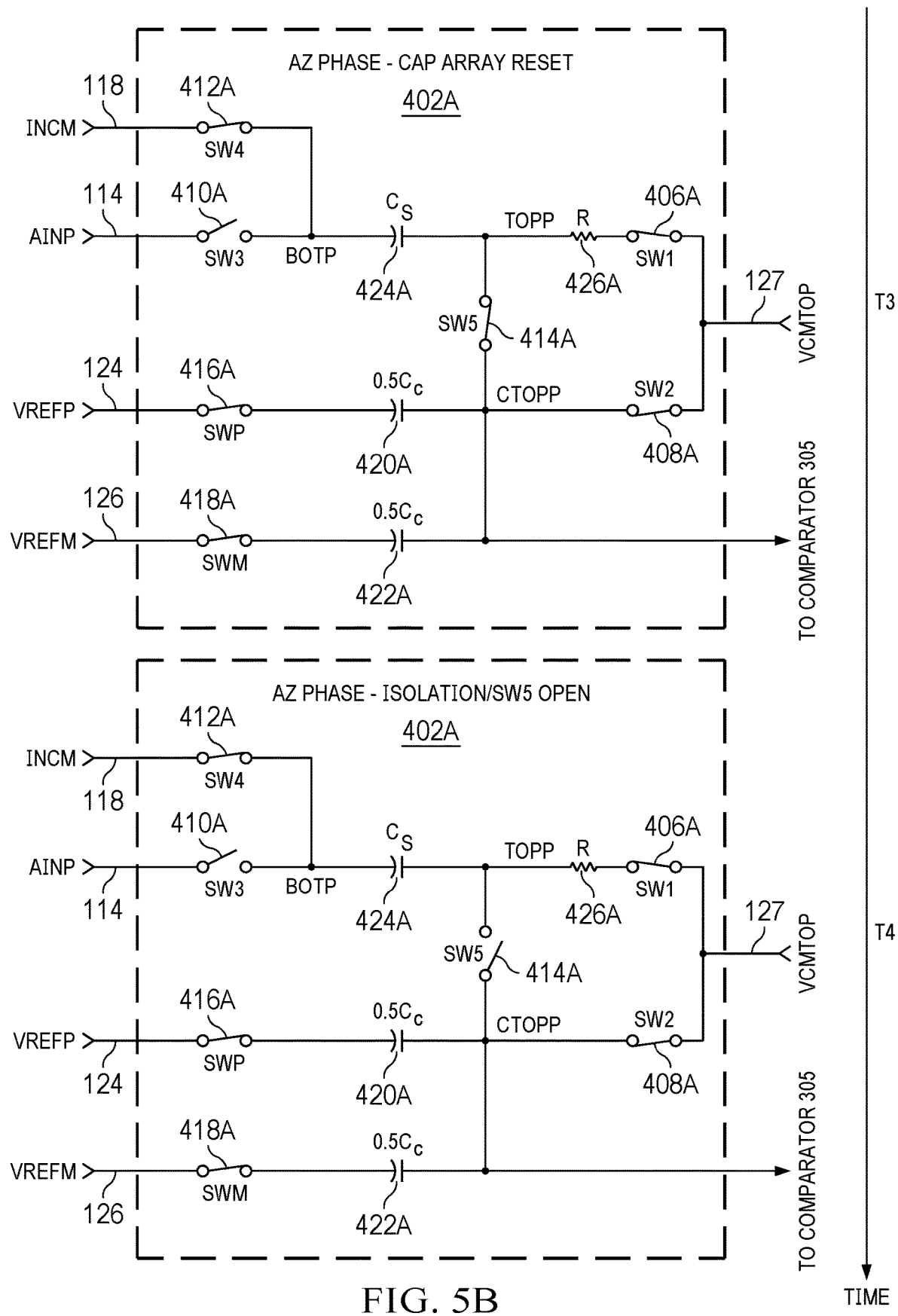
Figure 5C:
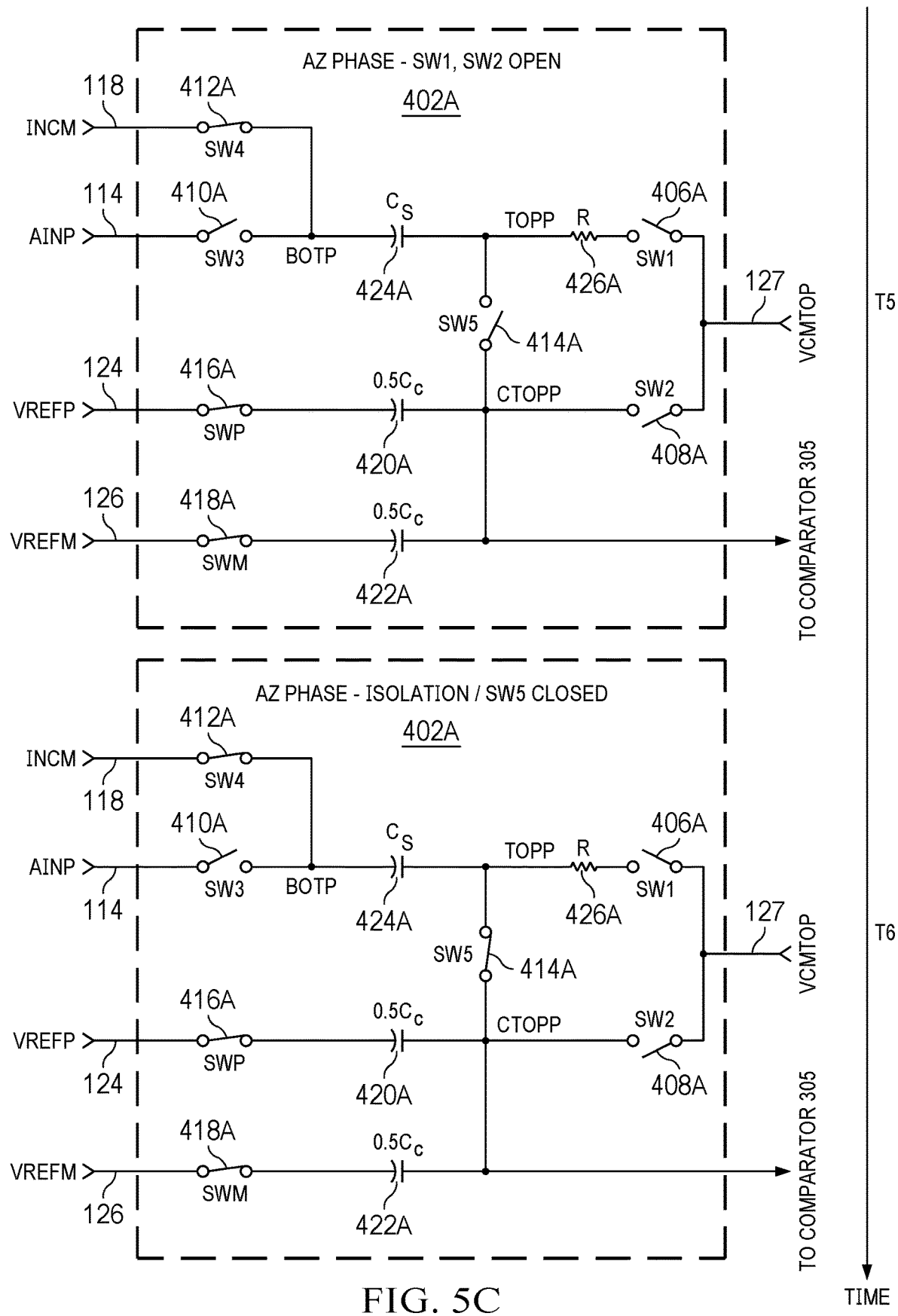
Figure 6:
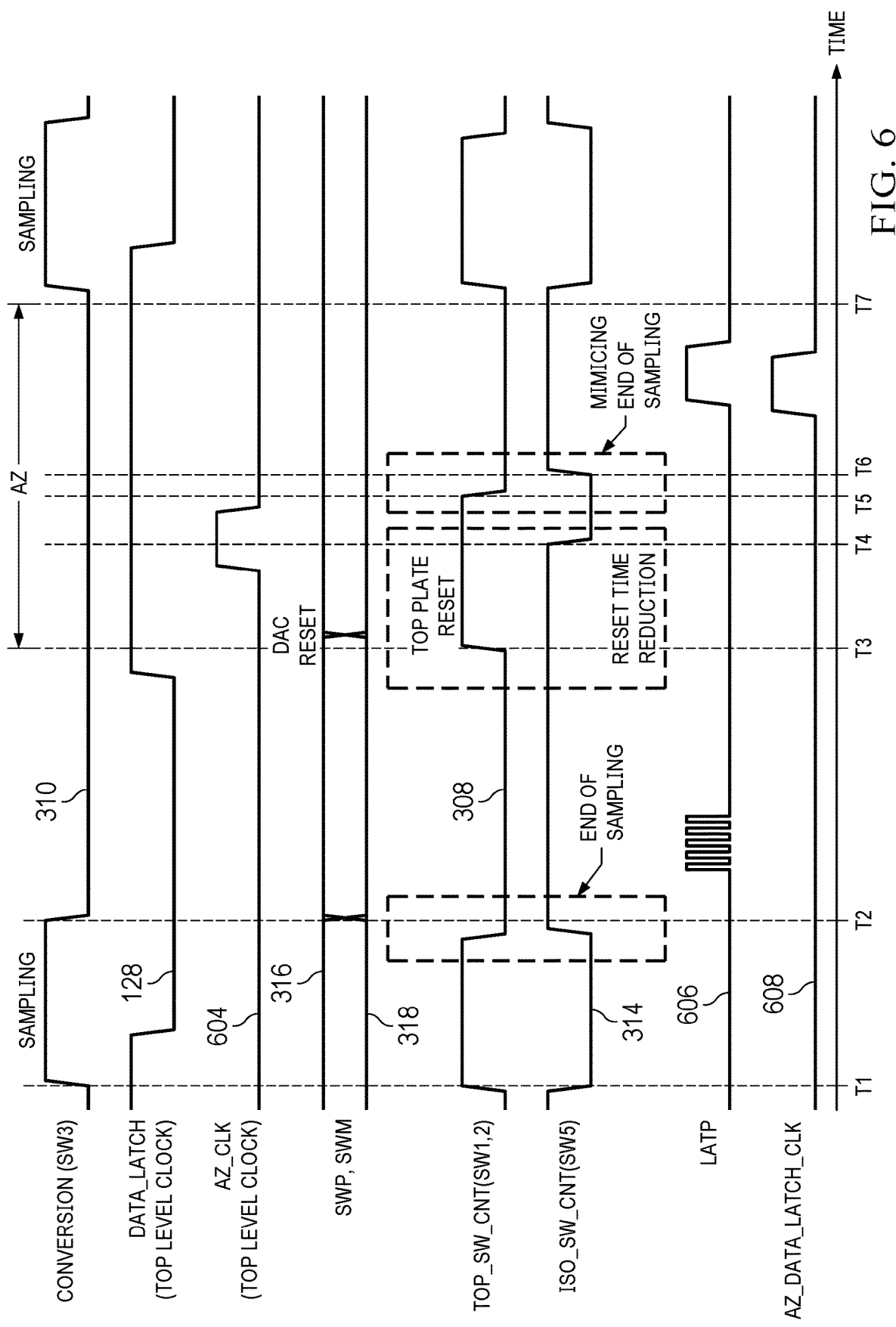
FIG. 6 illustrates signals provided by the controller circuitry of FIG. 3.

FIGS. 5A, 5B, and 5C illustrate multiple configurations of the C-DAC circuitry of FIG. 3. Each of FIG. 5A, FIG. 5B, and FIG. 5C illustrate part of a continuous, example timeline that beings at T1 and ends at T6, as shown in FIG. 6. Each timestamp (i.e., T1, T2, T3, T4, T5, and T6) on the example timeline of FIG. 6 corresponds to a configuration of the example C-DAC circuitry 302 during that time period. A given timestamp includes an example of the first circuitry 402A implemented with a specific set of switch states. While the example second circuitry 402B is not illustrated in FIGS. 5A, 5B, and 5C for simplicity, the state of any switch in the example second circuitry 402 can be derived at any timestamp because of the mirrored relationship between the example first circuitry 402A and example second circuitry 402B described above. In some examples, the node that couples one terminal of example SW2 408A, one terminal of example SW5 414A, the positive terminals of example capacitors $C_C$ 420A, 422A, and the negative terminal of the example comparator circuitry 305 may be referred to as a comparator side top positive (CTOPP) plate. In such examples, the node that couples the other terminal of example SW5 414A, the positive terminal of the example capacitor $C_S$ 424A, and the example resistor 426A may be referred to as the input side top positive (TOPP) plate. Accordingly, SW5 414A may be referred to as a top plate switch in some examples. Similarly, SW1 406A, SW2 408A, SW5 414B, SW1 406B, and SW2 408B may all be referred to as top plate switches.

The example timeline includes one complete cycle of operations and the start of a second cycle of operations performed by the SAR1 ADC circuitry 204. As illustrated in FIG. 5A, an example cycle of operations begins at T1. At T1 of the example timeline, switches SW1 406A, 406B are closed, switches SW2 408A, 408B are closed, switches SW3 410A, 410B are closed, switches SW4 412A, 412B are open, switches SW5 414A, 414B are open, switches SWP 416A, 416B are closed, and switches SWM 418A, 418B are closed.

The example C-DAC circuitry 302 includes the resistor 426A to reduce the noise bandwidth produced by the same switch network architecture within the MDAC circuitry 214. However, if current from the AINP signal 114 flows through the example sampling capacitor $C_S$ 424A and the example resistor 426A without flowing through SW5 (e.g. if SW5 were replaced by an electrical short), the voltage of the top plate (e.g., a node that includes both TOPP and CTOPP couplings as described above) fluctuates. This results in a large value $C_C$ to mitigate the voltage fluctuation and to mimic SAR1 sampling network and MDAC sampling.

Advantageously, the example C-DAC circuitry 302 described herein can be implemented with a relatively small value $C_C$ because of the inclusion of SW5. Furthermore, to keep reducing noise bandwidth in the MDAC circuitry 214, the example controller circuitry 304 closes SW1 406A, closes SW2 408A, and opens SW5 414A at T1. As a result, the voltage of the top plate is stabilized (e.g., voltage fluctuation is mitigated) by the VCMTOP signal and is still representative of the AINP signal 114. Similarly, in the example second circuitry 402B during T1, the voltage of the top plate is stabilized by the VCMTOP signal while still being representative of the AINM signal 116.

In some examples, the period between T1 and T2 of the example timeline is referred to as the sample phase. During the example sample phase, the C-DAC circuitry 302 samples the AINP signal 114 and the AINM signal 116, and the INCM signal 118 by charging the example sampling capacitors $C_S$ 424A, $C_S$ 424B. The C-DAC circuitry 302 then holds the charge of the sampling capacitors $C_S$ 424A, $C_S$ 424B constant for a period of time. The example C-DAC circuitry 302 may determine when to sample the AINP signal 114, the AINM signal 116, and the INCM signal 118 based on external clock circuitry. The amount of time that the sampled voltages are held constant may be pre-determined by a manufacturer and stored in the example memory 110.

At T2 of the example timeline, the example controller circuitry 304 provides switch signals such that switches SW1 406A, 406B transition to open, switches SW2 408A, 408B transition to open, switches SW3 410A, 410B transition to open, switches SW4 412A, 412B transition to closed, switches SW5 414A, 414B transition to closed, switches SWP 416A, 416B remain closed, and switches SWM 418A, 418B remain closed.

At T2, the example controller circuitry 304 controls the C-DAC circuitry 302 to sample the input AINP signal 114 and the AINM signal 116 as the differential voltage between the CTOPP plate of first circuitry 402A and the comparator side top minus (CTOPM) plate of second circuitry 402B. In some examples, the period between T2 and T3 of the example timeline is referred to as the conversion phase.

The example timeline continues in FIG. 5B. At T3 of the example timeline, the example controller circuitry 304 provides switch signals. Responsively, switches SW1 406A, 406B transition to closed, switches SW2 408A, 408B transition to closed, switches SW3 410A, 410B remain open, switches SW4 412A, 412B remain closed, switches SW5 414A, 414B remain closed, switches SWP 416A, 416B remain closed, and switches SWM 418A, 418B remain closed.

At the end of the conversion phase, the sampling capacitor $C_S$ 424A, the example capacitor $C_C$ 420A, and the example capacitor $C_C$ 422A contain information corresponding to the previous AINP signal 114 sample in the form of a stored charge. By closing SW1 406A and SW2 408A at T3, the example controller circuitry 304 discharges the capacitors in the first circuitry 402A. Similarly, the example controller circuitry 304 begins to discharge the capacitors in the second circuitry 402B at T3. The example AZ phase as described in this description is illustrated on the example timeline from T3 to T6. Within the example AZ phase, capacitors within the C-DAC circuitry 304 are discharged from T3 to T4.

The example AZ phase occurs within a residue amplification (RA) phase of the example ADC circuitry 106. During the RA phase, decisions of the example SAR1 ADC circuitry 204, and output values of the example MDAC circuitry 214 are available. Additionally, a residue amplifier is active during the RA phase.

At T4 of the example timeline, the example controller circuitry 304 provides switch signals. Responsively, switches SW1 406A, 406B remain closed, switches SW2 408A, 408B remain closed, switches SW3 410A, 410B remain open, switches SW4 412A, 412B remain closed, switches SW5 414A, 414B transition to open, switches SWP 416A, 416B remain closed, and switches SWM 418A, 418B remain closed.

Advantageously, by re-opening SW5 414A at T4, the example controller circuitry 304 repeats the initial opening of SW5 414A that occurred at T1. As a result, the example AZ phase illustrated in the example timeline of FIGS. 5A, 5B, and 5C captures the charge injection caused by the opening of SW5 414A. In turn, the controller circuitry 304 can correct for the charge injection caused by SW5 414A, leading to a lower offset voltage than other solutions. In contrast, said other solutions that only measure error with an offset sample at a comparator do not correct for the charge injection of an equivalent SW5 leading to a high overall offset voltage. Within the example AZ phase of this description, T4 may be referred to as the beginning of an isolation period in which the VCMTOP signal is isolated from other circuit nodes.

The example timeline continues at FIG. 5C. At T5 of the example timeline, the example controller circuitry 304 provides switch signals. Responsively, switches SW1 406A, 406B transition to open, switches SW2 408A, 408B transition to open, switches SW3 410A, 410B remain open, switches SW4 412A, 412B remain closed, switches SW5 414A, 414B remain open, switches SWP 416A, 416B remain closed, and switches SWM 418A, 418B remain closed.

Advantageously, by re-opening of SW1 406A and SW2 406B at T5, the example controller circuitry 304 repeats the initial opening of SW1 406A and SW2 406B at T2. As a result, the example AZ phase illustrated in the example timeline of FIGS. 5A, 5B, and 5C captures the current injection caused by the opening of SW1 406A and SW2 408A, leading to a lower offset voltage than other solutions that do not measure a corresponding charge injection.

At T6 of the example timeline, the example controller circuitry 304 provides switch signals. Responsively, switches SW1 406A, 406B remain open, switches SW2 408A, 408B remain open, switches SW3 410A, 410B remain open, switches SW4 412A, 412B remain open, switches SW5 414A, 414B transition to closed, switches SWP 416A, 416B remain closed, and switches SWM 418A, 418B remain closed.

Advantageously, by re-closing of SW5 414A at T6, the example controller circuitry 304 repeats the initial closing of SW5 414A at T2. As a result, the example AZ phase illustrated in the example timeline of FIGS. 5A, 5B, and 5C captures the charge injection caused by the closing of SW5 at T2, leading to a lower offset voltage than other solutions that do not measure a corresponding charge injection. Additionally, the example controller circuitry 304 closes SW1 410A and SW2 412A at T6 so that the voltage VCMTOP does not affect the voltage of the top plate until it is needed to stabilize the next sample of the AINP signal (e.g., at T1 of the subsequent cycle).

The example C-DAC circuitry 302 remains in the configuration corresponding to T6 of FIG. 5C until the AZ phase is completed. Once the AZ phase is completed, a new cycle of the example timeline 5A, 5B, 5C may begin, producing additional MSBs 122 that correspond to additional samples of the AINP 114 signals and AINM signals 116.

FIG. 6 is a timeline illustrating signals generated by the example controller circuitry 304 of FIG. 3. The example timeline of FIG. 6 includes the example SW3 signal 310, the example data latch signal 128, an example AZ clock signal 604, the example SWM signal 316, the example SWP signal 318, the example SW1 signal 306, the example SW2 signal 308, the example SW5 signal 314, an example latch enable on positive edge (LATP) signal 606, and an example AZ_DATA_LATCH_CLK signal 608.

The example timeline of FIG. 6 corresponds to the example timeline and switch configurations of FIGS. 5A, 5B, 5C in that T1 in FIG. 5A corresponds to the same point in time as T1 of FIG. 6, T2 in FIG. 5A corresponds to the same point in time as T2 of FIG. 6, etc. The timeline of FIG. 6 includes a set of signals that transition between a high supply voltage and a low supply voltage. As used above herein, a high supply voltage may be referred to as a logical '1', and a low supply voltage may be referred to as a logical '0'.

The example SW3 signal 310 determines when the example C-DAC circuitry 302 is in the sample phase. In particular, the example C-DAC circuitry 302 is in the sample phase when the SW3 signal 310 is at a logical '1' (and switches SW3 410A, 410B are correspondingly closed) and is in either the conversion phase or the AZ phase when the SW3 signal 310 is at a logical '0' (and switches SW3 410A, 410B are correspondingly open).

As described above in connection with FIG. 5A, and as shown by the example SW3 signal 310, the sample phase begins at T1. The sample phase ends and the conversion phase begins at T2, when the example SW1 signal 306, example SW2 signal 308, and the SW5 signal 314 change values.

The example data latch signal 128 describes when the output values from the comparator circuitry 305 (corresponding to digital bits) has been successfully stored in the memory 110. In particular, the example memory controller circuitry 130 resets the data latch signal 128 to a logical '0' during the sample phase. Once the output value of the comparator circuitry 305 is successfully stored in the memory 110, the memory controller circuitry 130 transitions the data latch signal 128 to a logical '1'. In response to identifying a rising edge of the data latch signal 128, the example controller circuitry 304 changes the values of the example SW1 signal 306 and example SW2 signal 308 at T3. In the example of FIG. 6, the beginning of the example AZ phase occurs at T3. In other examples the beginning of the example AZ phase is described as when the data latch signal 128 transitions to a logical '1', which occurs a small amount of time before T3.

The example AZ clock signal 604 is a period signal that includes a pulse (e.g., a transition from a logical '0' to a logical '1' and back to a logical '0') of a set-width once per cycle. The example AZ clock signal may be generated by external clock signal and used by the example controller circuitry 304 to determine when to change switch states during the example AZ phase.

FIG. 6 shows only the transitions of the example SWM signal 316, the example SWP signal 318, the example SW1 signal 306, the example SW2 signal 308, and the example SW5 signal 314 for simplicity. More generally, when any of the switch signals from FIG. 3 are at a logical '0', the corresponding switches within the C-DAC circuitry 302 are in the open state. Similarly, whenever the controller circuitry 304 sets a switch signal to a logical '1', the corresponding switches within the C-DAC circuitry 302 are in the closed state.

Between T3 and T4, the example controller circuitry 304 transitions the example SWM signal 316 and transitions the example SWP signal 318 to a reset state. In the reset state, the example capacitors $C_C$ 420A, $C_C$ 422A, $C_C$ 420B, and $C_C$ connect to a terminal that receives the example VCM-TOP signal 128, thereby discharging all information related to the previous sample.

As described in connection with FIG. 5C, the example AZ phase begins with the discharge of capacitors within the example C-DAC circuitry 302. In some examples, the discharging of capacitors is also described as resetting the voltage of the top plate. The discharge period of the example AZ phase ends at T5 when the example SW1, SW2 signals transition from a logical '1' to a logical '0'. In response to observing the rising edge of the AZ clock signal 604, the example controller circuitry 304 transitions the SW5 signal 314 to a logical '0' at T4, thereby opening SW5 414A and SW5 414B. Advantageously, after the discharge period ends at T5, the additional switch transitions made by the controller circuitry 304 at T5 and T6 mimic the end of the sample period. As a result, the example controller circuitry 304 can measure and correct for the charge injection that occurs at the end of the sample period.

Beginning at T5, the example controller circuitry 304 repeats the switch transitions that end the sample phase and begin the conversion phase. In particular, the example controller circuitry 304 transitions the SW5 signal 314 to a logical '0' at T4, waits an amount of time, and then transitions both the SW1 signal 306 and the SW2 signal 308 to a logical '0' at T5. In some examples, the controller circuitry 304 transmits the switch signals so that the difference in time between T5 and T4 is greater or equal to a threshold amount of time. By implementing a threshold amount of time between T4 and T5, the example controller circuitry 304 ensures that the charge injection caused by the opening of SW5 414A is fully captured and can be accurately compensated for. The example controller circuitry also transitions the SW5 signal 314 to a logical '1' at T6.

The repeat of switch transitions from the sample and conversion phase can cause the input voltages at both terminals of the example comparator circuitry 305 to exhibit a transient response. As a result, the example controller circuitry 304 waits an amount of time after T6 so that the input voltages can settle. As used above and herein, waiting for an signal to settle refers to waiting, after a change in the signal, until an amount of variation in the signal value over time is lower than a threshold.

Once the voltages at the input terminals are sufficiently stable, the example controller circuitry 304 enables the AZ decision to be stored in memory by transitioning the AZ_DATA_LATCH_CLK signal 608 to a logical '1'. The example controller circuitry 304 then transitions a pulse in the LATP signal 606 to cause the comparator circuitry 305 to perform the AZ decision. As used above and herein, the AZ decision refers to a comparison made by the example comparator circuitry 305 during the example AZ phase. In particular, the example comparator circuitry 305 compares the voltage at the negative input terminal to the voltage at the positive input terminal, which is the analog equivalent of the digital values generated during the previous conversion phase.

Other solutions of SAR ADC architectures focus on measuring the offset of the comparator circuitry 305 when determining adjustments to digital values. To measure the offset, other solutions close top plate switches SW1 406A, 406B, and SW2 408A, 408B during previous AZ decisions to form direct connections (i.e., form electrical shorts) between: 1), the VCMTOP signal 127 and the negative terminal of the comparator circuitry 305, and 2), the VCOM-TOP signal 127 and the positive terminal of the comparator circuitry 305. As a result, the comparator circuitry 305 would have a 0V differential between terminals during previous AZ decisions, allowing the offset to be measured. However, the comparator circuitry 305 generates kickback noise (e.g., unwanted voltage) when the output value of the comparator changes. The magnitude of the kickback noise is dependent on the state of the switches within the C-DAC circuitry 302. Because other solutions of SAR ADC architectures keep top plate switches SW1 406A, 406B, and SW2 408A, 408B closed during previous AZ decisions, the switch states during previous AZ decisions are not reflective of the switch states during conversion phase (e.g., when the output value of the comparator circuitry 305 changed to produce a digital value). As a result, previous AZ decisions are not reflective of kickback that occurs during the conversion phase, and the total offset voltage of other SAR ADC architectures is relatively large.

Advantageously, as described in this description, the example controller circuitry 304 controls the C-DAC circuitry 302 to have top plate switches SW1 406A, 406B, and SW2 408A, 408B open during the example AZ phase. This configuration is illustrated in FIG. 6, as the SW1 signal 306 and the SW2 signal 308 are in a logical '0' when the pulse in the LATP signal 606 between T6 and T7 triggers the example AZ phase. As a result, the example SAR1 ADC circuitry 204 measures and corrects for comparator kickback that occurs during the conversion phase. Accordingly, the example ADC circuitry 106 exhibits a lower total offset voltage than other multi-stage SAR ADC architectures.

The example AZ decision produces new digital values that are used by controller circuitry 304 to determine whether to correct the previous digital values. For example, the controller circuitry 304 may initialize the SAR such that the first MSB of a sample is a logical '1'. If the new digital value from the AZ decision is a logical '1' (e.g., the positive terminal has a greater voltage than a negative terminal) as a new digital value, the comparator causes the SAR to reset the first MSB to a logical '0'. In contrast, if the new digital value from the AZ decision is a logical '0' (e.g., the positive terminal has a smaller voltage than the negative terminal) as a new digital value, the first MSB is left as a logical '1'. The controller circuitry 304 then sets the next bit within the SAR to 1 and the same test is done, continuing this binary search until every bit in the SAR has been tested. The resulting code is the digital approximation of the sampled input voltage and is finally provided by the SAR at the end of the conversion.

Advantageously, by repeating the switch transitions of the sample and conversion phase during the example AZ phase, the example controller circuitry 304 produces an AZ decision which is more reflective of the multiple sources of error in the C-DAC circuitry 302 than other solutions. In turn, the example SAR1 ADC circuitry 204 makes more accurate compensations for internal error and exhibits less offset voltage than other solutions.

While the inclusion of the resistor 426A helps reduce noise in the example MDAC circuitry 214, it can also decrease the rate at which the capacitors in the switch network discharge. Therefore, during previous AZ phases, other solutions that do not capture charge injection leave the SW5 414A in its current state at the end of the conversion period.

Advantageously, the example controller circuitry 304 opens SW5 414A during the AZ phase to capture the charge injection caused by the opening of SW5 414 at T1. However, when SW5 414A is in an open state, the flow of current produced by the discharge of 424A is impeded by the resistor 426A before reaching the comparator circuitry 305 to be removed from the SAR1 ADC circuitry 204. Therefore, the example controller circuitry 304 keeps SW5 414A in the closed state when the example AZ Phase begins and waits an amount of time before opening SW5 414A. In particular, the example controller circuitry 304 waits until T4 to open SW5 414A instead of opening SW5 414A at T3. As a result, the flow of current produced by the discharge of 424A avoids the resistor 426A, leading to a faster discharge than other solutions.

While an example manner of implementing the SAR1 ADC circuitry 204 of FIG. 2 is illustrated in FIG. 3, one or more of the elements, processes, and/or devices illustrated in FIG. 3 may be combined, divided, re-arranged, omitted, eliminated, and/or implemented in any other way. Further, the example C-DAC circuitry 302, the example controller circuitry 304, and/or, more generally, the example SAR1 ADC circuitry 204, may be implemented by hardware alone or by hardware in combination with software and/or firmware. Thus, for example, any of the example C-DAC circuitry 302, the example controller circuitry 304, and/or, more generally, the example SAR1 ADC circuitry 204, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example SAR1 ADC circuitry 204 of FIG. 2 may include one or more elements, processes, and/or devices in addition to, or instead of, those illustrated in FIG. 3, and/or may include more than one of any or all of the illustrated elements, processes and devices.

Figure 7:
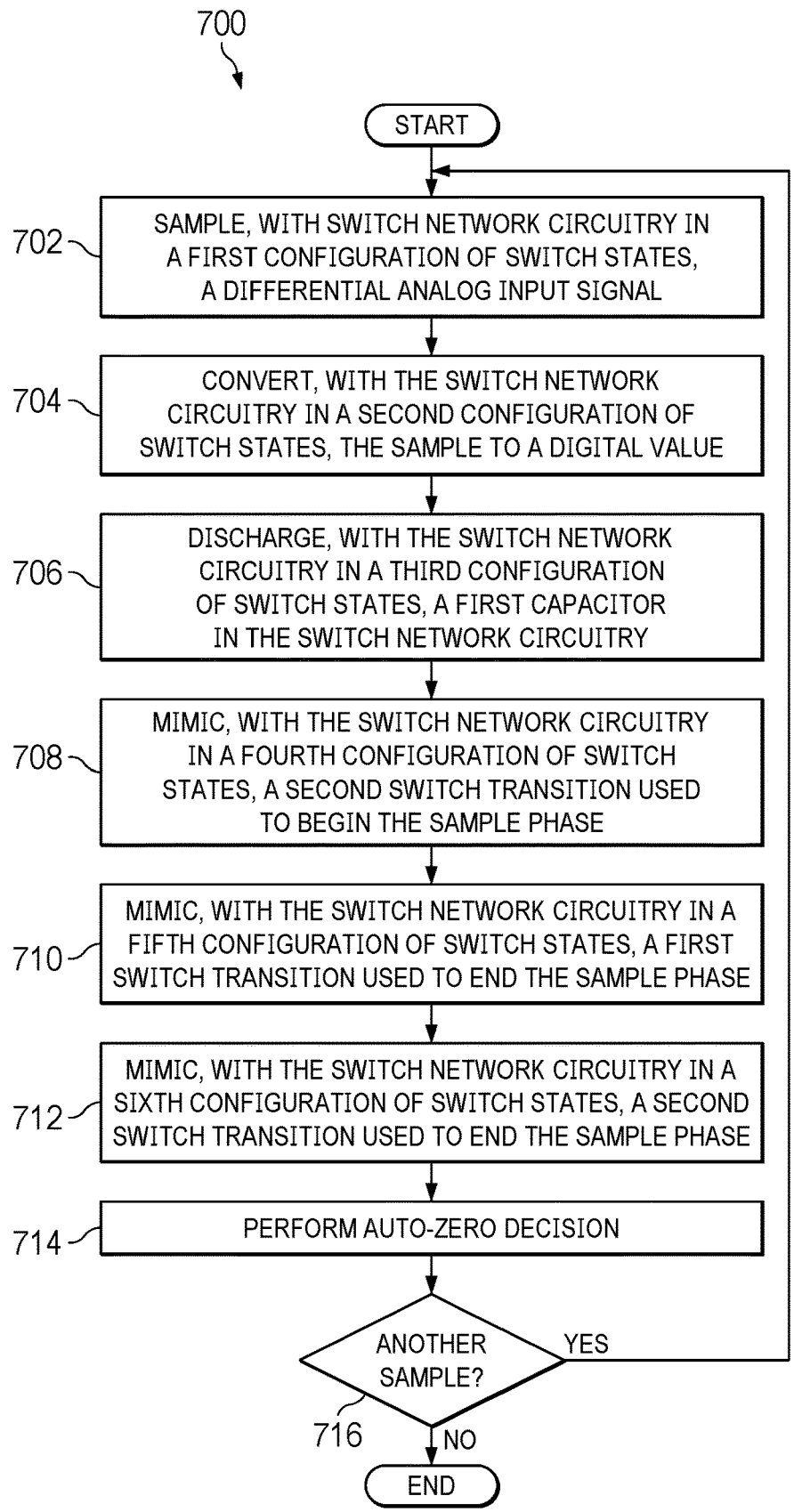
FIG. 7 is a flowchart representative of an example process that may be performed using machine readable instructions that can be executed and/or hardware configured to implement the controller circuitry of FIG. 3, and/or, more generally, by the SAR1 ADC circuitry of FIG. 3 to convert an analog voltage to a digital value.

FIG. 7 is a flowchart representative of an example process 700 that may be performed using hardware and/or using machine readable instructions that can be executed and/or hardware configured to implement the controller circuitry of FIG. 3, and/or, more generally, that may be performed in the SAR1 ADC circuitry of FIG. 3 to convert an analog voltage to a digital value.

The example process 700 begins when the example controller circuitry 304 causes the C-DAC circuitry 302 to sample, in a first configuration of switch states, a differential analog input. (Block 702). To sample the differential input, the example controller circuitry 304 provides switch signals that cause switches SW1 406A, 406B to close, switches SW2 408A, 408B to close, and switches SW5 414A, 414B to open at block 702. After the switch transitions of block 702, the example C-DAC circuitry 302 is in the first configuration of switch states as described in connection with FIG. 5A and T1.

The example controller circuitry 304 causes the C-DAC circuitry 302 to convert, in a second configuration of switch states, the sample to a digital value. (Block 704). To convert the sample, the example controller circuitry 304 provides switch signals. Responsively, cause switches SW1 406A, 406B to open, switches SW2 408A, 408B to open, switches SW3 410A, 410B to open, switches SW4 412A, 412B to closed, and switches SW5 414A, 414B to close. After the switch transitions of block 704, the example C-DAC circuitry 302 is in the second configuration of switch states as described in connection with the conversion phase of FIG. 5A and T2.

The example controller circuitry 304 causes the C-DAC circuitry 302 to discharge, in a third configuration of switch states, capacitors in the C-DAC circuitry 302. (Block 706). To discharge, the example controller circuitry 304 provides switch signals. Responsively, switches SW1 406A, 406B to close, and switches SW2 408A, 408B to close. After the switch transitions of block 706, the example C-DAC circuitry 302 is in the third configuration of switch states as described in connection with FIG. 5B and T3. The closing of switches performed at block 706 by the example controller circuitry 304 repeats first switch transitions used to begin the sample phase.

The example controller circuitry 304 causes the C-DAC circuitry 302 to repeat, in a fourth configuration of switch states, second switch transitions used to begin the sample phase. (Block 708). In particular, the example controller circuitry 304 provides switch signals. Responsively, switches SW5 414A, 414B to open. After the switch transitions of block 708, the example C-DAC circuitry 302 is in the fourth configuration of switch states as described in connection with FIG. 5B and T4.

The example controller circuitry 304 causes the C-DAC circuitry 302 to repeat, in a fifth configuration of switch states, first switch transitions used to end the sample phase. (Block 710). In particular, the example controller circuitry 304 provides switch signals. Responsively, switches SW1 406A, 406B to open, and switches SW2 408A, 408B to open. After the switch transitions of block 710, the example C-DAC circuitry 302 is in the fifth configuration of switch states as described in connection with FIG. 5C and T5.

The example controller circuitry 304 causes the C-DAC circuitry 302 to repeat, in a sixth configuration of switch states, second switch transitions used to end the sample phase. (Block 712). In particular, the example controller circuitry 304 provides switch signals that cause switches SW5 414A, 414B to close.

The example controller circuitry 304 performs an example AZ decision. (Block 714). To perform the example AZ decision, the example controller circuitry 304 causes the comparator circuitry 305 to produce a second set of digital values as described in connection with FIG. 6. Before performing the AZ decision of block 714, the example controller circuitry 304 may wait an amount of time between execution of blocks 712 and 714 so that the voltage at the input terminals of the comparator circuitry 305 can settle to a sufficiently minimal variation over time.

The example controller circuitry 304 determines whether to perform another sample. (Block 716). The example controller circuitry 304 may determine whether to perform another sample for any reason, including but not limited to information stored in previous samples of the analog input signal, instructions from the processor circuitry 112, external clock circuitry, etc. If the example controller circuitry 304 determines to perform another sample, (Block 716: Yes), the example process 700 returns to block 702, where the example controller circuitry 304 provides switch signals. Responsively, the C-DAC circuitry 302 transitions back to the first configuration for an additional sample at block 702. If the example controller circuitry 304 determines not to perform another sample (Block 716: No), the example process 700 ends.

Figure 8:
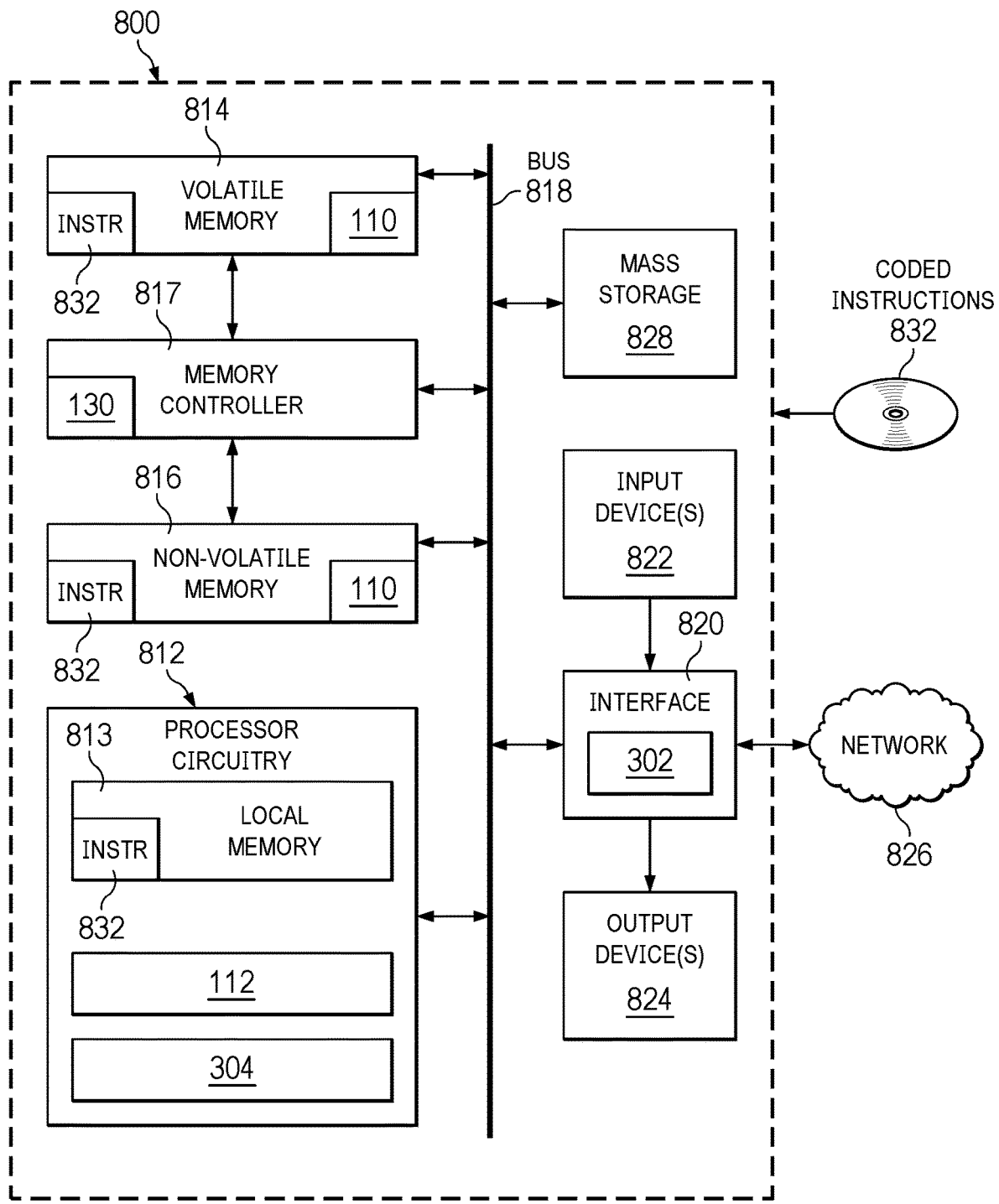
FIG. 8 is a block diagram of an example processing platform including processor circuitry structured to execute the example machine readable instructions and/or the example operations of FIG. 7 to implement the SAR1 ADC circuitry of FIG. 3.

FIG. 8 is a block diagram of an example processor platform 800 structured to execute and/or instantiate the machine readable instructions and/or the operations of FIG. 7 to implement the SAR1 ADC circuitry 204 of FIG. 2. The processor platform 800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 800 of the illustrated example includes processor circuitry 812. The processor circuitry 812 of the illustrated example is hardware. For example, the processor circuitry 812 can be implemented by one or more integrated circuits, logic circuits, FPGAs, microprocessors, CPUs, GPUs, DSPs, and/or microcontrollers from any desired family or manufacturer. The processor circuitry 812 may be implemented by one or more semiconductor based (e.g., silicon based) devices. In this example, the processor circuitry 812 implements the processor circuitry 112 and the controller circuitry 304.

The processor circuitry 812 of the illustrated example includes a local memory 813 (e.g., a cache, registers, etc.). The processor circuitry 812 of the illustrated example is in communication with a main memory including a volatile memory 814 and a non-volatile memory 816 by a bus 818. The volatile memory 814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 816 may be implemented by flash memory and/or any other desired type of memory device. In this example, one or both of the main memory 814, 816 implements example memory 110. Access to the main memory 814, 816 of the illustrated example is controlled by a memory controller 817. In this example, the memory controller 817 implements the example memory controller circuitry 130.

The processor platform 800 of the illustrated example also includes interface circuitry 820. The interface circuitry 820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In this example, the interface circuitry 820 implements the example C-DAC circuitry 302.

In the illustrated example, one or more input devices 822 are connected to the interface circuitry 820. The input device(s) 822 permit(s) a user to enter data and/or commands into the processor circuitry 812. The input device(s) 822 can be implemented by, for example, an audio sensor, a microphone, a camera (still or video), a keyboard, a button, a mouse, a touchscreen, a track-pad, a trackball, an isopoint device, and/or a voice recognition system.

One or more output devices 824 are also connected to the interface circuitry 820 of the illustrated example. The output device(s) 824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 820 of the illustrated example, thus, includes a graphics driver card, a graphics driver chip, and/or graphics processor circuitry such as a GPU.

The interface circuitry 820 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 826. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 800 of the illustrated example also includes one or more mass storage devices 828 to store software and/or data. Examples of such mass storage devices 828 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 832, which may be implemented by the machine readable instructions of FIG. 7, may be stored in the mass storage device 828, in the volatile memory 814, in the non-volatile memory 816, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the accuracy of multi-stage SAR ADC circuits. Example SAR1 ADC circuitry 204 includes example controller circuitry 304 that implements an example AZ phase that repeats the switch transitions of prior sample and conversion phases. The example controller circuitry 304 also keeps switches SW5 414A, 414B closed during the beginning of the example AZ phase to facilitate a faster discharge of capacitors within the example C-DAC circuitry 302. As a result, the example SAR1 ADC circuitry 204 measures and corrects for multiple sources of internal error such as charge injection caused by switch transitions, capacitor leakage, and comparator kickback noise, resulting in lower offset voltage than other solutions.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

A flowchart representative of example operations such as performed in hardware and/or by machine readable instructions, which may be executed to configure processor circuitry to implement the SAR1 ADC circuitry 204 of FIG. 2, is shown in FIG. 7. The machine readable instructions may be one or more executable programs or portion(s) of an executable program for execution by processor circuitry, such as the processor circuitry 812 shown in the example processor platform 800 described below in connection with FIG. 8. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware.

The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices.

Further, although the example program is described with reference to the flowchart illustrated in FIG. 7, many other methods of implementing the example SAR1 ADC circuitry 204 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices. When decrypted, decompressed, and/or combined, the parts form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIG. 7 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Modifications are possible in the described embodiments, and other embodiments are possible, within the scope of the claims.

What is claimed is:
1. A device comprising:
capacitive digital to analog converter (C-DAC) circuitry including switches configured to transition between an open state and a closed state responsive to switch signals; and controller circuitry configured to provide the switch signals to cause the C-DAC circuitry to:
configure the switches into a first configuration to sample a differential analog input signal, wherein configuring switches into a first configuration includes: (a) a transition of a first switch and a second switch to the closed state, and (b) a transition of a third switch to the open state;
configure the switches into a second configuration to convert the sample into a digital value, wherein configuring switches into a second configuration includes: (a) a transition of the first switch and the second switch to the open state, and (b) a transition of the third switch to the closed state;
configure the switches into a third configuration to discharge a capacitor in the C-DAC circuitry, wherein configuring switches into the third configuration includes a transition of the first switch and the second switch to the closed state, wherein configuring switches into the third configuration begins an Auto Zero (AZ) phase with the third switch in the closed state;
configure the switches into a fourth configuration to repeat the transition of the third switch to the open state corresponding to the first configuration;
configure the switches into a fifth configuration to repeat the transition of the first switch and the second switch to the open state corresponding to the second configuration;
configure the switches into a sixth configuration to repeat the transition of the third switch to the closed state corresponding to the second configuration; and
perform an AZ decision with the switches in the sixth configuration.

2. The device of claim 1, wherein:
the first switch includes a first connection to a terminal configured to receive a voltage common mode top (VCMTOP) signal;
the first switch includes a second connection to an input side top positive (TOPP) plate;
the second switch includes a first connection to the terminal;
the second switch includes a second connection to a comparator side top positive (CTOPP) plate;
the third switch includes a first connection to the TOPP plate; and
the third switch includes a second connection to the CTOPP plate.

3. The device of claim 1, wherein the device further comprises a comparator circuit having a positive terminal and a negative terminal, and the C-DAC circuitry further includes:
first circuit elements including a first half of the switches, the first circuit elements coupled to the positive terminal; and
second circuit elements including a second half of the switches, the second half of the switches mirroring the first half of the switches, and the second circuit elements coupled to the negative terminal.

4. The device of claim 3, wherein to convert the sample to the digital value, the comparator circuit is configured to provide an output signal indicating a difference between:
a first voltage from the first half of circuit elements, the first voltage generated with the switches in the first configuration of switch states; and
a second voltage from the second half of circuit elements, the second voltage generated with the switches in the first configuration of switch states.

5. The device of claim 1, wherein the controller circuitry is configured to:
receive an offset voltage from the C-DAC circuitry, the offset voltage based on configuring the switches into the fourth configuration, the fifth configuration, and the sixth configuration, the offset voltage responsive to a first amount of error and a second amount of error in the digital value; and
correct the first amount of error and the second amount of error in the digital value based on the offset voltage.

6. The device of claim 1, wherein:
the capacitor discharges at a first rate with the third switch in a closed state;
the capacitor discharges at a second rate with the third switch in an open state, the second rate smaller than the first rate; and
the controller circuitry is configured to wait an amount of time after the AZ phase begins before causing the third switch to transition from the closed state to the open state.

7. The device of claim 1, wherein:
the C-DAC circuitry is first C-DAC circuitry; and
the device is configured to provide the digital value to a digital to analog converter circuit, the digital to analog converter circuit to include second C-DAC circuitry, the first C-DAC circuitry and the second C-DAC circuitry to include the same components in the same configuration.

8. An apparatus comprising:
first analog to digital converter (ADC) circuitry, the first ADC circuitry to include:
capacitive digital to analog converter (C-DAC) circuitry including a switches, respective ones of the switches configured to transition between an open state and a closed state based on a switch signals; and
controller circuitry configured to provide the switch signals to cause the C-DAC circuitry to:
configure the switches into a first configuration to sample a differential analog input signal, wherein configuring switches into a first configuration includes: (a) a transition of a first switch and a second switch to the closed state, and (b) a transition of a third switch to the open state;
configure the switches into a second configuration to convert the sample into a digital value, wherein configuring switches into a second configuration includes: (a) a transition of the first switch and the second switch to the open state, and (b) a transition of the third switch to the closed state;
configure the switches into a third configuration to discharge a capacitor in the C-DAC circuitry, wherein configuring switches into the third configuration includes a transition of the first switch and the second switch to the closed state, wherein configuring switches into the third configuration begins an Auto Zero (AZ) phase with the third switch in the closed state;
configure the switches into a fourth configuration to repeat the transition of the third switch to the open state corresponding to the first configuration;
configure the switches into a fifth configuration to repeat the transition of the first switch and the second switch to the open state corresponding to the second configuration;

configure the switches into a sixth configuration to repeat the transition of the third switch to the closed state corresponding to the second configuration; and perform an AZ decision with the switches in the sixth configuration;

digital to analog converter (DAC) circuitry configured to convert the first set of digital bits to an analog voltage; and second ADC circuitry configured to:
receive a difference between the differential analog input signal and the analog voltage; and
convert the difference into a second set of digital bits, the second set corresponding to the least significant bits of a digital value.

9. The apparatus of claim 8, wherein the C-DAC circuitry further includes:
a first portion of circuit elements, the first portion to include a first half of the switches;
a second portion of circuit elements, the second portion to include a second half of the switches, the second portion to mirror the first portion;
a positive terminal of a comparator circuit coupled to the first portion of circuit elements; and
a negative terminal of a comparator circuit coupled to the second portion of circuit elements.

10. The apparatus of claim 8, wherein:
the first switch includes a first connection to a terminal configured to receive a voltage common mode top (VCMTOP) signal;
the first switch includes a second connection to an input side top positive (TOPP) plate;
the second switch includes a first connection to the terminal;
the second switch includes a second connection to a comparator side top positive (CTOPP) plate;
the third switch includes a first connection to the TOPP plate; and
the third switch includes a second connection to the CTOPP plate.

11. The apparatus of claim 9, wherein to convert the sample to the digital value, the comparator circuit is configured to provide a difference between:
a first voltage from the first half of circuit elements, the first voltage generated with the switches in the first configuration of switch states; and
a second voltage from the second half of circuit elements, the second voltage generated with the switches in the first configuration of switch states.

12. The apparatus of claim 8, wherein the controller circuitry is configured to:
receive an offset voltage from the C-DAC circuitry, the offset voltage based on configuring the switches into the fourth configuration, the fifth configuration, and the sixth configuration, the offset voltage responsive to a first amount of error and a second amount of error in the digital value; and
correct the first amount of error and the second amount of error in the digital value based on the offset voltage.

13. The apparatus of claim 8, wherein:
the capacitor discharges at a first rate with the third switch in a closed state;
the capacitor discharges at a second rate with the third switch in an open state, the second rate smaller than the first rate; and the controller circuitry is configured to wait an amount of time after the AZ phase begins before causing the third switch to transition from the closed state to the open state.

14. The apparatus of claim 13, wherein:
the C-DAC circuitry is first C-DAC circuitry; and
the DAC circuitry includes second C-DAC circuitry, the first C-DAC circuitry and the second C-DAC circuitry to include the same components in the same configuration.

15. The apparatus of claim 13, wherein:
the ADC circuitry is first ADC circuitry;
the digital value is a most significant bit within a set of bits; and
the apparatus further includes second ADC circuitry to generate a least significant bit within the set of bits based on the difference between the differential analog input signal and the analog voltage produced by the DAC circuitry.

16. A method comprising:
providing, with controller circuitry, switch signals to capacitive digital to analog converter (C-DAC) circuitry, the C-DAC circuitry including switches, respective ones of the switches configured to transition between an open state and a closed state based on a plurality of switch signals;
configuring, with the switch signals, the switches into a first configuration to sample a differential analog input signal, wherein configuring switches into a first configuration includes: (a) a transition of a first switch and a second switch to the closed state, and (b) a transition of a third switch to the open state;
configuring, with the switch signals, the switches into a second configuration to convert the sample into a digital value, wherein configuring switches into a second configuration includes: (a) a transition of the first switch and the second switch to the open state, and (b) a transition of the third switch to the closed state;
configuring, with the switch signals, the switches into a third configuration to discharge a capacitor in the C-DAC circuitry, wherein configuring switches into the third configuration includes a transition of the first switch and the second switch to the closed state, wherein configuring switches into the third configuration begins an Auto Zero (AZ) phase with the third switch in the closed state;
configuring, with the switch signals, the switches into a fourth configuration to repeat the transition of the third switch to the open state corresponding to the first configuration;
configuring, with the switch signals, the switches into a fifth configuration to repeat the transition of the first switch and the second switch to the open state corresponding to the second configuration;
configuring, with the switch signals, the switches into a sixth configuration to repeat the transition of the third switch to the closed state corresponding to the second configuration; and
performing an AZ decision with the switches in the sixth configuration.

17. The method of claim 16, wherein the C-DAC circuitry further includes:
a first portion of circuit elements, the first portion to include a first half of the switches;
a second portion of circuit elements, the second portion to include a second half of the switches, the second portion to mirror the first portion;

a positive terminal of a comparator circuit coupled to the first portion of circuit elements; and a negative terminal of a comparator circuit coupled to the second portion of circuit elements.

18. The method of claim 17, wherein converting the sample to a digital value includes providing, with the comparator circuit, a difference between:

a first voltage from the first portion of circuit elements, the first voltage generated with the switches in the first configuration of switch states; and a second voltage from the second portion of circuit elements, the second voltage generated with the switches in the first configuration of switch states.

19. The method of claim 16, further including:

receiving an offset voltage from the C-DAC circuitry, the offset voltage based on the fourth configuration, the fifth configuration, and the sixth configuration, the offset voltage responsive to a first amount of error and a second amount of error in the digital value; and correcting the first amount of error and the second amount of error in the digital value based on the offset voltage.

20. The method of claim 16, wherein:

the capacitor discharges at a first rate with the third switch in a closed state;

the capacitor discharges at a second rate with the third switch in an open state, the second rate smaller than the first rate; and the method further includes waiting an amount of time after the AZ phase begins before causing the third switch to transition from the closed state to the open state.

* * * * *